(12) United States Patent
Ahmed (10) Patent No.: US 6,850,575 B1
(45) Date of Patent: Feb. 1, 2005

(54) SINGLE SIDE BAND MODULATOR

(75) Inventor: Vaseem Ahmed, Hasbrouck Heights, NJ (US)

(73) Assignee: Synergy Microwave Corporation, Paterson, NJ (US)

( * ) Notice: Subject to any disclaimer, the term of this patent is extended or adjusted under 35 U.S.C. 154(b) by 867 days.

(21) Appl. No.: 09/721,193

(22) Filed: Nov. 22, 2000

Related U.S. Application Data (60) Provisional application No. 60/167,308, filed on Nov. 24, 1999.

(51) Int. Cl.$^7$ .............................. H03C 1/52; H03C 1/60
(52) U.S. Cl. ....................................... 375/301; 332/170
(58) Field of Search ................. 375/301; 455/326–327; 332/105, 170; 342/372

(56) References Cited

U.S. PATENT DOCUMENTS

| | | | | |
|---|---|---|---|---|
| 3,831,097 A | * | 8/1974 | Neuf ........................... | 455/326 |
| 4,002,969 A | * | 1/1977 | Barley et al. ................ | 324/613 |
| 4,063,176 A | * | 12/1977 | Milligan et al. ............ | 455/326 |
| 4,125,810 A | * | 11/1978 | Pavio ........................... | 455/327 |
| 4,224,572 A | * | 9/1980 | Will ............................. | 455/326 |
| 4,306,311 A | * | 12/1981 | Igarashi ...................... | 455/327 |
| 4,768,000 A | * | 8/1988 | Pavio et al. ................. | 332/170 |
| 5,367,271 A | * | 11/1994 | Yamamoto et al. ......... | 332/105 |
| 5,416,449 A | * | 5/1995 | Joshi ........................... | 332/170 |
| 6,029,059 A | * | 2/2000 | Bojer ........................... | 455/326 |
| 6,054,948 A | * | 4/2000 | Dean ............................ | 342/372 |
| 6,441,783 B1 | * | 8/2002 | Dean ............................ | 342/372 |
| 6,496,545 B1 | * | 12/2002 | Liu .............................. | 375/301 |

OTHER PUBLICATIONS

Shankar R. Joshi, "Novel I/Q Modulators Mix Cellular Signals," Synergy® Microwave Corp., [Retrieved Apr. 19, 2002]. Retrieved from the Internet <URL:www.synergymwave.com/products/moddemod/moddemodpdf/Mod_demodTutorial.pdf> , no date listed.

"Mixers," Synergy® Microwave Corp., [Retrieved Apr. 19, 2002] Retrieved from the Internet <URL:www.synergymwave.com/products/mixers/mixers_pdf/MixerTutorial.pdf>, no date listed.

"Modulators," Mini-Circuits®, [Retrieved Apr. 18, 2002] Retrieved from the Internet <URL:www.minicircuits.com/appnote/mod11-2.pdf> (last modified Jul. 17, 2001).

Michael Ellis, "Introduction to Mixers," 1999. <URL:members.tripod.com/michaelgellis/mixersm.html>.

Ian Purdie, "Ian Purdie's Amateur Radio Tutorial Pages: Double Balanced Mixers and Baluns," © 1999. <URL:my.integritynet.com.au/purdic/dbl_bal_mix.htm>.

\* cited by examiner

*Primary Examiner*—Stephen Chin
*Assistant Examiner*—Lawrence Williams
(74) *Attorney, Agent, or Firm*—Lerner, David, Littenberg, Krumholz & Mentlik, LLP (57) ABSTRACT

The present invention relates to a single side band modulator for splitting a signal into a first split signal and a second split signal 90 degrees out of phase with the first split signal. A first double balanced mixer modulates the first split signal and includes a transformer, a modulating signal input, and a first diode ring. The transformer connects the first diode ring to a quadrature hybrid. A second double balanced mixer modulates the second split signal and includes a transformer, a modulating signal input, and a second diode ring. The transformer of the second double balanced mixer connects the second diode ring to the quadrature hybrid. The first and second diode rings are connected in parallel and are connected to a third transformer which performs the function of a power combiner.

18 Claims, 7 Drawing Sheets

SINGLE SIDE BAND MODULATOR

CROSS-REFERENCE TO RELATED APPLICATIONS

The present application claims the benefit of U.S. Provisional Application No. 60/167,308, entitled SINGLE SIDE BAND MODULATOR, filed Nov. 24, 1999, the entire disclosure of which is hereby incorporated by reference herein.

BACKGROUND OF THE INVENTION

Single side band (SSB) modulators are used in many communication ECM systems. Most of these modern systems employ solid state modulators which have been designed using both active and passive components in a variety of circuit configurations. These configurations include single balanced structures and double balanced structures. Unwanted side band suppression and carrier rejection are important performance issues for such structures.

One way of creating a single side band signal is the phase cancellation method. A low frequency (LF) signal, typically an information-bearing signal, is split into two identical but 90° phase shifted signals. The two low frequency signals are said to be in quadrature. A radio frequency carrier signal is provided by local oscillator (LO), and is also split into separate signals, so that the separate signals have a 90° phase shift relative to each other. One radio frequency carrier signal and one low frequency (LF) signal are combined in each of two balanced mixers or modulators, and the output signals of the mixers are summed. The system acts to suppress the carrier signal, and to provide an increased amplitude single side band signal.

Figure 1:
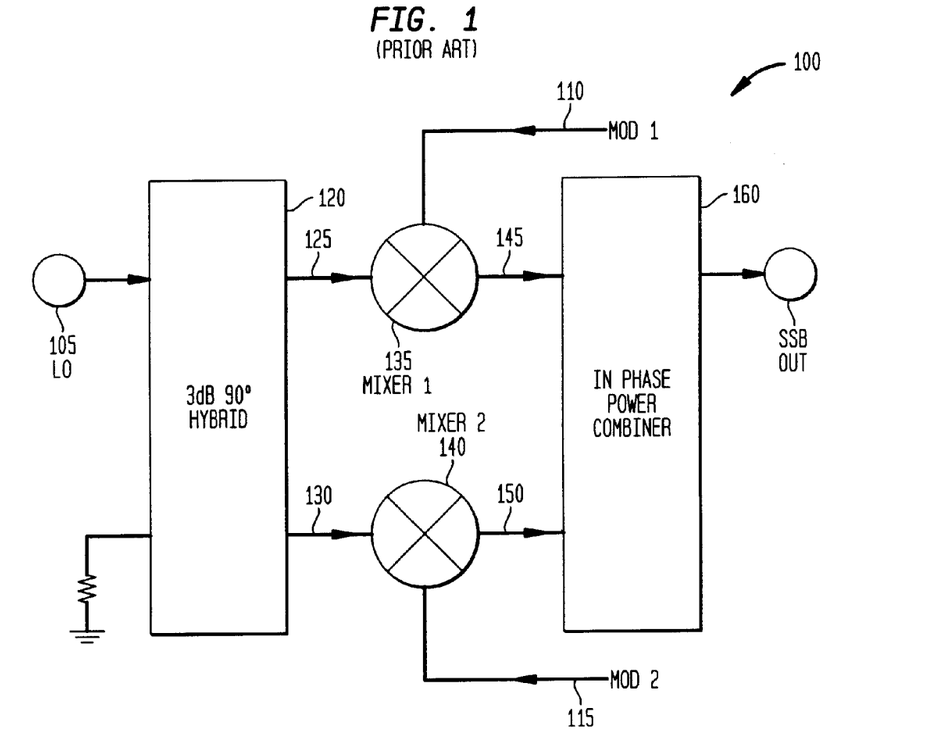
FIG. 1 is a block diagram of a known single-side band modulator.

FIG. 1 is a block diagram of a typical single sideband modulator 100 known to the prior art. In such a single side band system, it is well known in the art that when a carrier signal and modulating signal are mixed in a double balanced mixer or a modulator, the output thereof is generally the sum or difference of the signals. The carrier signal or local oscillator (LO) signal is provided at the local oscillator port 105, or LO 105. The modulating signal or LF signal is provided in this figure at two points. A first LF signal 110 and a second LF signal 115 are identical modulating signals that have equal amplitudes, but are 90 degrees out of phase. An LO signal applied at LO 105 is fed into the 90 degree hybrid 120. This will spilt the LO signal into two halves. A first split LO signal 125 and a second split LO signal 130 differing in phase by 90 degrees will be outputted by the 90 degree hybrid 120. The first LO split signal 125 is fed into a connected first mixer 135. The second LO split signal 130 is fed into a connected second mixer 140. The first LF signal 110 is fed to the first mixer 135, and the second LF signal 115 is fed to the second mixer 140. A first RF signal 145 is output from the first mixer 135 to the in-phase power combiner 160. A second RF signal 150 is output from a second mixer 140 to the in-phase power combiner 160. Within the in-phase power combiner 160, the two signals, 145 and 150, are summed to provide a single radio frequency side band signal without a carrier signal.

Figure 2:
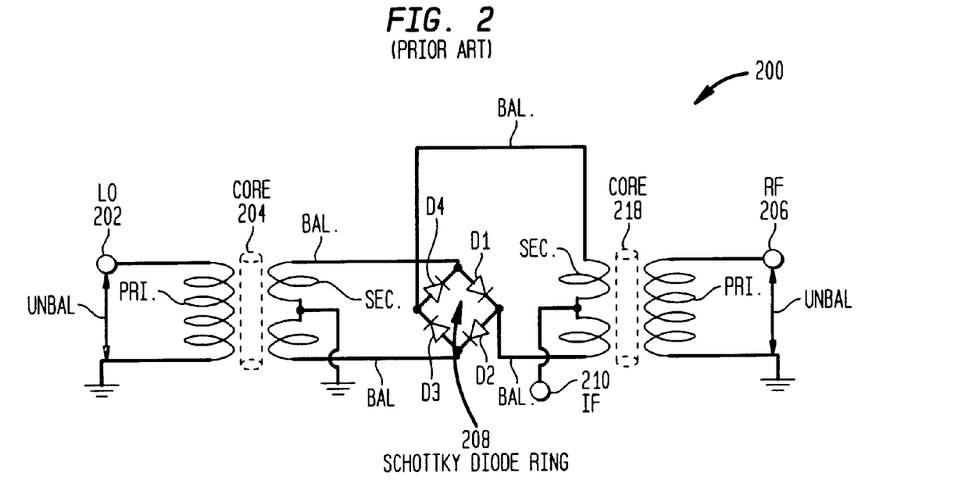
FIG. 2 is a circuit diagram of a double balanced mixer.

To obtain high performance, the first and second mixers 135 and 140 are typically double balanced mixers, or DBMs. A prior art DBM 200 is shown in FIG. 2. Such a DBM 200 consists of a local oscillator (LO) port 202, a LO transformer 204 for providing balanced output to quad ring 208, a radio frequency (RF) port 206, an RF transformer 218 for providing balanced signals from the quad ring 208 to the RF port 206. The balanced signals drive a schottky diode quad ring 208. The schottky diode ring 208 is a combination of four (quad) schottky diodes arranged in a ring configuration. The modulating [LF] signal of this circuit is at the intermediate frequency or IF port 210. In the SSB modulator 100 (FIG. 1), it is the signal at RF port 206 that is fed into the in-phase power combiner 160. Thus we see that in a prior art SSB modulator 100 there will be at least two transformers for each of the mixers, making a total of four or more transformers due to the mixers.

Figure 3:
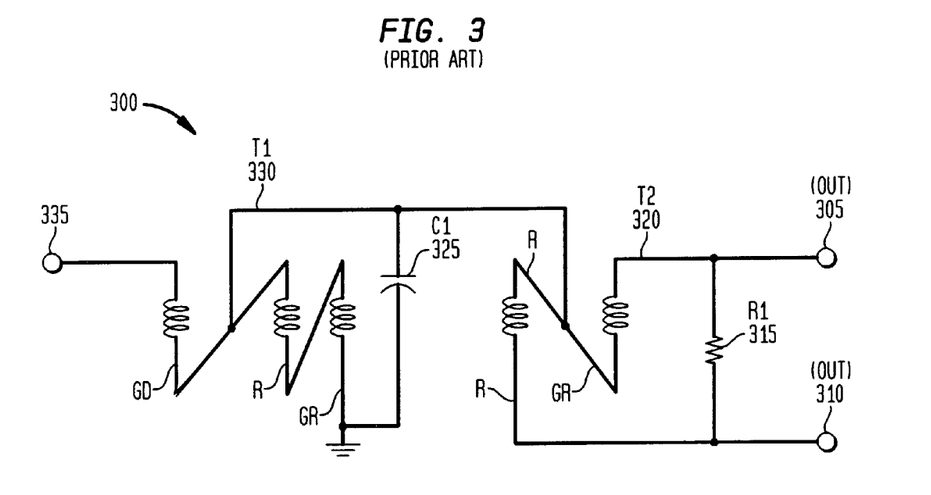
FIG. 3 is a circuit diagram of the in-phase power divider/combiner.
Figure 4A:
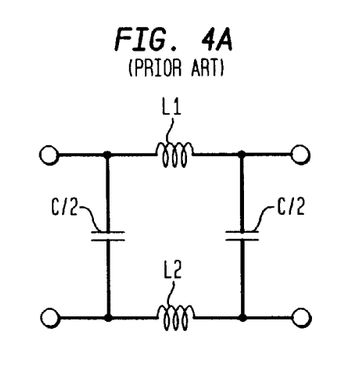
FIGS. 4A–D illustrate a circuit diagram, amplitude response, and block diagram of a 90 degree hybrid.
Figure 4B:
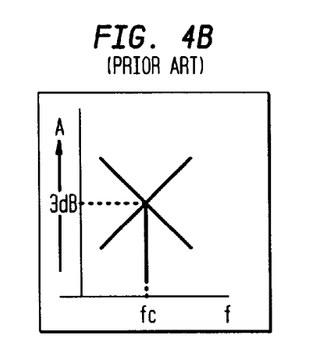
Figure 4C:
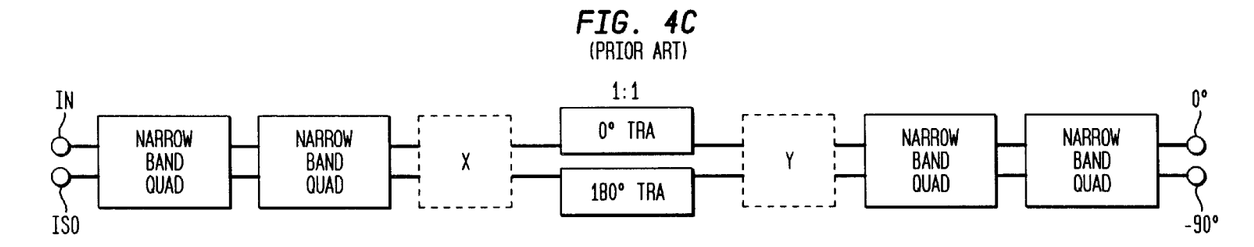
Figure 4D:
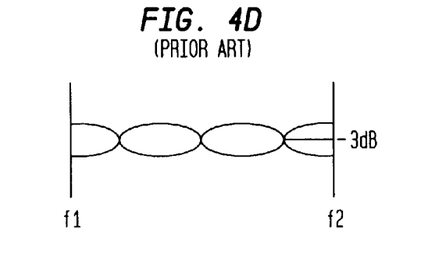

The circuit diagram of a prior art in-phase power divider/combiner 300 is shown in FIG. 3. Note that such a device can be either a combiner or a divider, but in SSB modulator 100, it is used as a combiner. The two modulated RF signals 145 and 150 are applied to ports 305 and 310. A resistor 315 connects the two ports 305 and 310. In parallel to the resistor 315 is the first transformer 320. The first transformer is connected to port 305 on one winding and port 310 at the other winding. A capacitor 325 is connected to the first transformer 320, which is in turn connected to a second transformer 330. The output port 335 is connected to the second transformer 330.

Diagrams of embodiments of a prior art 90 degree hybrid are shown in FIG. 4. FIG. 4A shows a circuit diagram of a narrow band 90 degree hybrid. FIG. 4B shows the amplitude response versus the frequency of such a 90 degree hybrid. FIG. 4C shows a block diagram of a wide band 90 degree hybrid. FIG. 4D shows the amplitude response versus the frequency for such a wide band 90 degree hybrid.

Thus, the prior art implementation of the SSB modulator will have even more transformers, and other components. It is desirable for reasons of cost-efficiency, reliability, and performance to reduce the number of components in high frequency applications of an SSB modulator.

SUMMARY OF THE INVENTION

An aspect of the present invention is an SSB modulator comprising of a 90° hybrid, two DBMs modified such that they require only a single RF transformer. More specifically, each DBM has its Schottky diode ring connected in parallel [on RF side only] to the other. This allows the elimination of the prior art RF transformer from each of the DBMs. The power combiner transformer also acts as a balanced feed network for RF connections to the quad rings.

An aspect of the present invention is a single side band modulator comprising a quadrature hybrid for splitting a signal into a first split signal and a second split signal 90 degrees out of phase with the first split signal but otherwise identical, a first double balanced mixer for modulating the first split signal with a first modulating signal to form a first output signal, the first double balanced mixer having a first transformer, a first modulating signal input, and a first diode ring, wherein the first transformer electrically connects said first diode ring to said quadrature hybrid, a second double balanced mixer for modulating the second split signal with a second modulating signal in balance with said first modulating signal to form a second output signal, the second double balanced mixer having a second transformer, a second modulating signal input, and a second diode ring, wherein the first transformer electrically connects the second diode ring to the quadrature hybrid, a third transformer, a first and second connection connecting the first diode ring to the second diode ring in parallel, and further connecting the first and second diode rings to the third transformer wherein said third transformer performs the function of a power combiner on the first and second output signals which are in balance.

BRIEF DESCRIPTION OF THE DRAWINGS

FIG. 4 is a circuit diagram of 90 degree hybrid.

DETAILED DESCRIPTION OF THE PREFERRED EMBODIMENT

The invention is an implementation of a single side band (SSB) modulator, resulting in improved performance, reduced component count and subsequently reduced cost and size.

Figure 11:
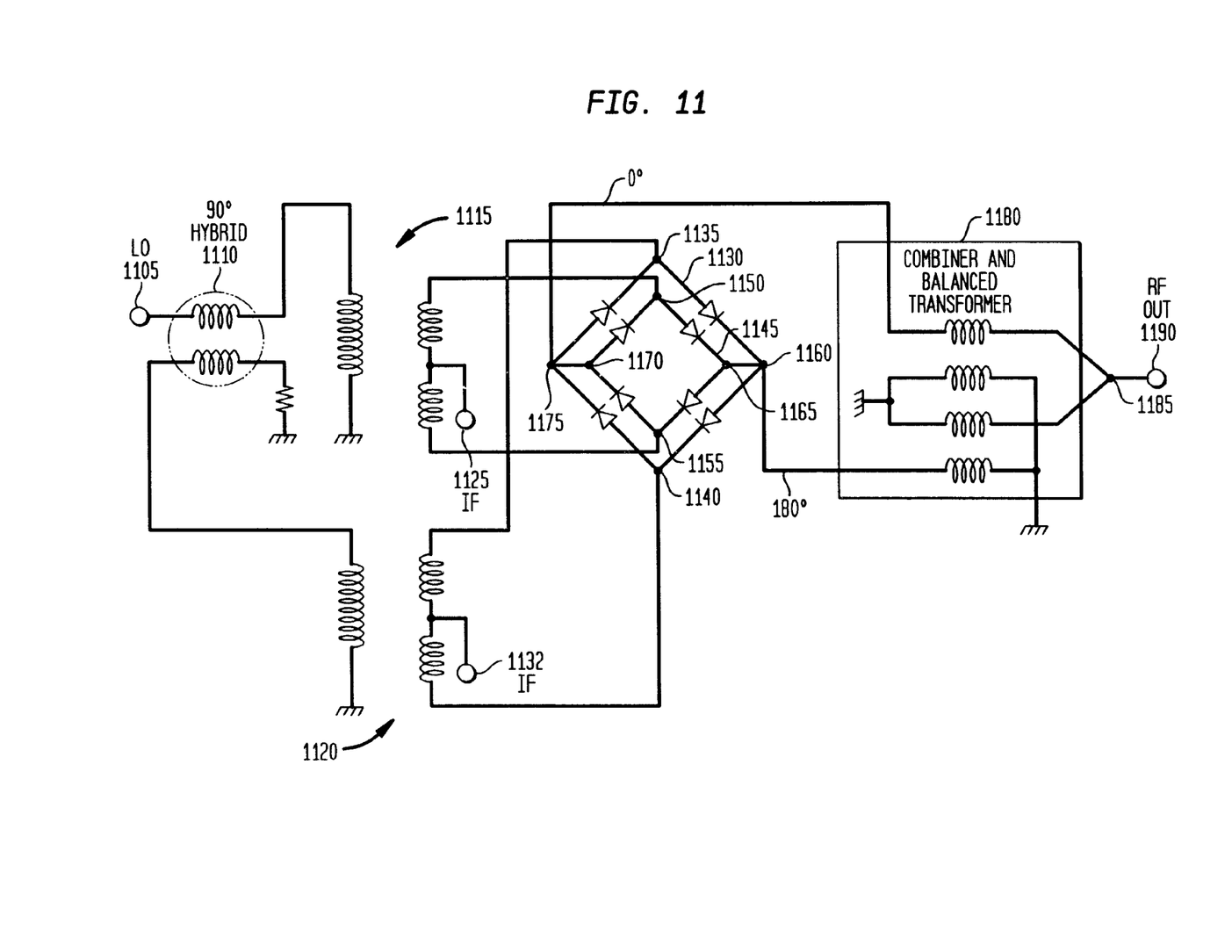
FIG. 11 is a circuit diagram showing the single-side band modulator according to a preferred embodiment.

FIG. 11 is a circuit diagram of one embodiment of the present invention. At the LO port 1105 a local oscillator signal is applied. The 90 degree hybrid 1110 creates two signals in quadrature. In the LO side first transformer 1115 yields a 1:4 impedance change, as does the LO side second transformer 1120. First IF port 1125 and second IF port 1132 tap the secondary winding of the respective transformers. 90 degree phase shifted low frequency modulating signals are applied to the first and second IF ports 1125 and 1132. The outer schottky diode ring 1130 is connected in parallel to the second transformer 1120 at the points 1135 and 1140. The inner schottky diode ring 1145 is connected in parallel to the first transformer 1115 at the points 1150 and 1155. However, the outer schottky diode ring 1130 is not connected in parallel to the inner schottky diode ring 1145 at points 1135 and 1150 or at points 1140 and 1155. The outer ring point 1160 is connected to the inner ring point 1165, and the outer ring point 1175 is connected to the inner ring point 1170. Thus the inner ring 1145 and the outer ring 1130 are connected in parallel. The RF transformer 1180 is also connected to points 1160 and 1175. The parallel quad rings 1130 and 1145 output from point 1175 a signal to transformer 1180. A signal is also outputted form point 1160 that is 180 degrees out of phase with the signal from point 1175. The RF transformer 1180 will perform two functions. One, it will match the impedance between the RF out port 1190 and the impedance found across the ring diodes. Two, it will, at sufficiently high frequencies, combine the two signals from port 1125 and port 1132 at point 1185 if the two signal are in balance. In the particular embodiment shown, the transformer 1180 should combine signals together having a frequency of 500–3000 MHz. Thus the signal at RF out 1190 will be a single side band with a suppressed carrier.

It is recommended that careful consideration be given to impedance matching in the SSB modulator. Proper impedance matching allows for transfer of power with minimal loss from one component to the other. If the impedances are not properly matched, the circuit losses will increase.

Figure 5:
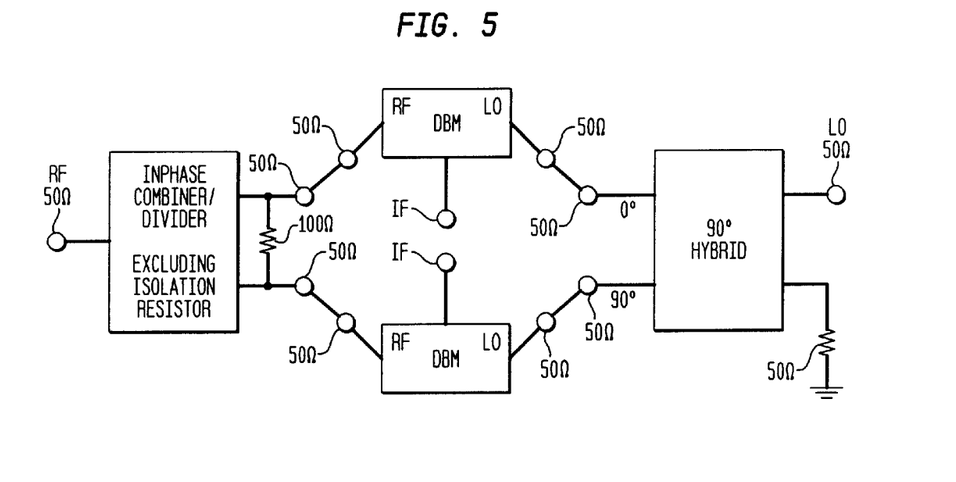
FIG. 5 is a block diagram of impedance matching in a single-side band modulator.

FIG. 5 is a block diagram of a SSB modulator with specific impedance requirements designated. In this approach, each of the building blocks is designed around a 50 Ω system, meaning a 50 Ω source and a 50 Ω load is assumed.

Figure 6:
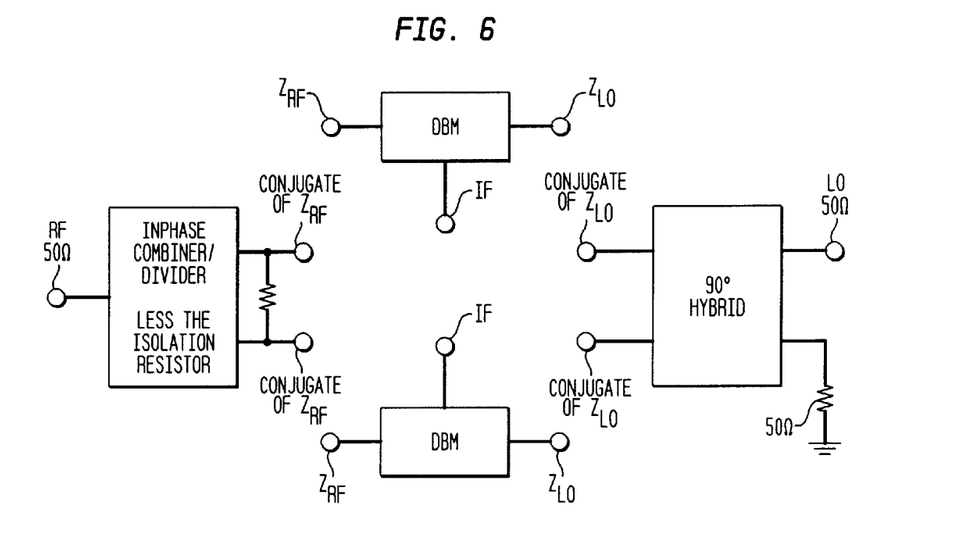
FIG. 6 is an exploded block diagram of impedance matching of RF ports within a single-side band modulator.

FIG. 6 shows a block diagram of an SSB modulator with its various components exploded apart to illustrate another way of looking at impedance matching. For example, if the DBMs have $Z_{RF}$ & $Z_{LO}$ impedances on RF & LO ports, then the in-phase divider/combiner and quadrature hybrid should respectively present conjugate values of $Z_{RF}$ & $Z_{LO}$ for maximum power transfer. Impedances $Z_{RF}$ & $Z_{LO}$ are expressed as complex numbers, in other words as a combination of real & imaginary parts. A conjugate impedance should present the same real value where as the imaginary part has to be of opposite sign with the same magnitude.

Figure 7:
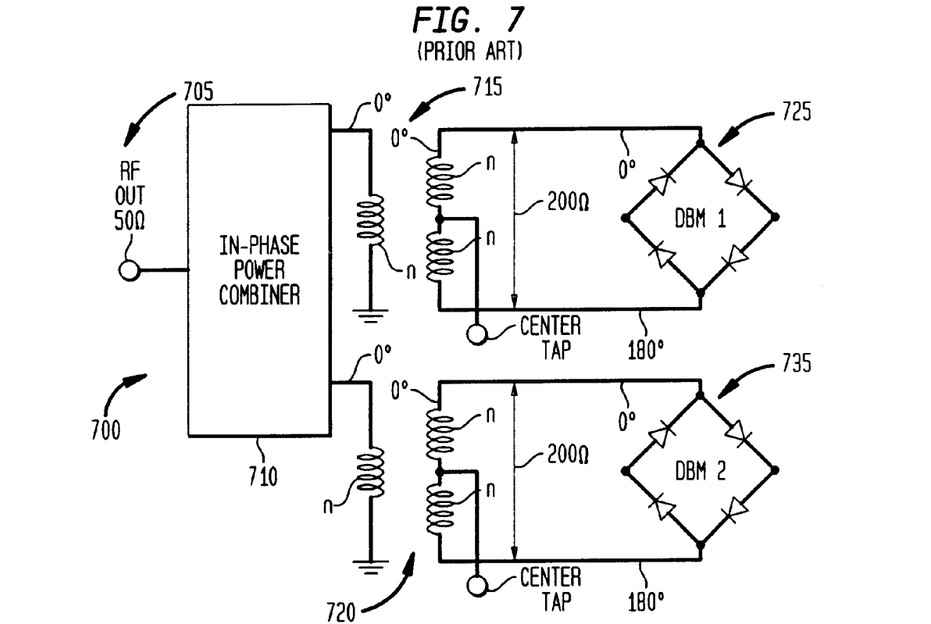
FIG. 7 is a circuit diagram of the two double balanced mixers and the attached in-phase power combiner.

FIG. 7 illustrates the considerations of impedance matching between an in-phase combiner/divider and the two DBMs of a prior art SSB modulator by showing components at the circuit level. The RF port 705 of the in-phase power combiner 710 has a 50 Ω unbalanced impedance applied. The transformer 715 of the first DBM 725 and the transformer 720 of the second DBM 735 each have a 2–1 winding ratio. This leads to a $(n+n/n)^2 \times 50 = 200$ Ω balanced load on the diode side of the transformers 715 and 720. Note that the two signals from each quad ring are balanced. This 180 degrees phase difference allows the transformer 1180 (FIG. 11) to act as a power combiner.

In the prior art SSB modulator 700 there will be two DBMs, each with two transformers. One transformer balances the LO port, and one transformer balances the RF output port. However, there are two quad rings, which can be connected in parallel. FIG. 8 shows an aspect of the invention in which the parallel connection between the Schottky diodes yields a simplified circuit.

Figure 8A:
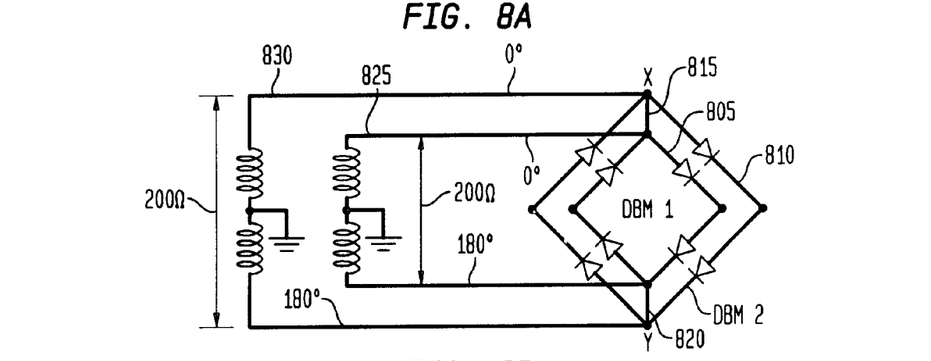
FIG. 8 is a pair of circuit diagrams which show the effect of placing the two schottky diode rings in parallel.
Figure 8B:
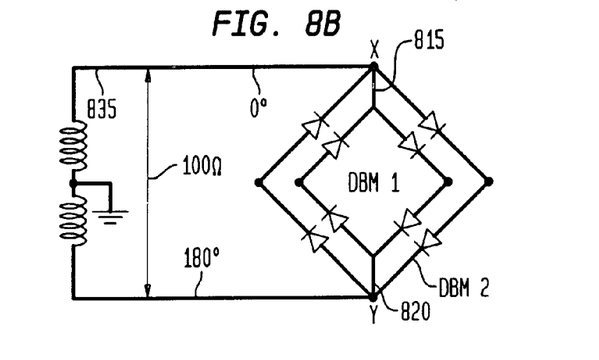

FIG. 8A shows the schottky ring associated with the first DBM 805 and the schottky ring associated with the second DBM 810 connected in parallel by parallel connections X 815 and Y 820. As in FIG. 7, the transformer 825 and transformer 830 are considered separately, and each has a 200 Ω impedance across them. However, this circuit is equivalent to the circuit shown in FIG. 8b. The two diode rings are connected in parallel on the RF side, resulting in 100 Ω load across X 815 and Y 820. Thus the transformer on the RF side will provide a 50 Ω impedance at the RF output port and provide a 100 Ω balanced load across X and Y.

Figure 9:
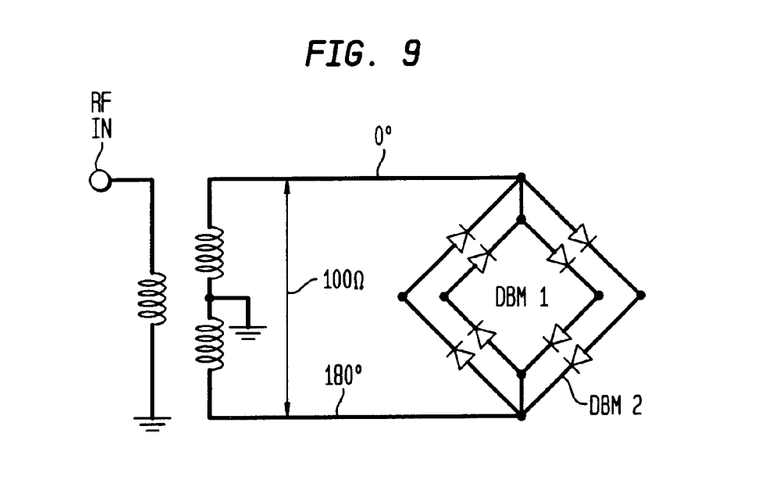
FIG. 9 is a circuit diagram showing an embodiment of the double balanced mixer with the associated RF transformer.
Figure 10:
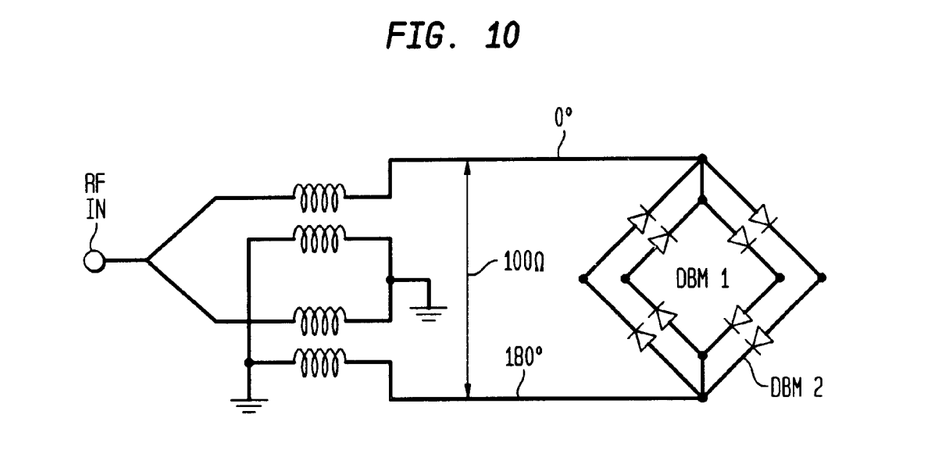
FIG. 10 is a circuit diagram of a three wire type circuit as an embodiment of the double balanced mixer.

Such a transformer may take several forms, two of which are shown in FIGS. 9 and 10. FIG. 9 is suited for low frequency application up to 500 MHz. FIG. 10 is suitable for high frequency (500 MHz –3000 MHz) and wide band applications.

Thus, by matching impedances and ensuring the signals from the parallel Schottky diode rings are in balance, the invention advantageously allows the use of only one transformer to receive balanced signals from the diode assembly. The transformer 1180, due to high frequency of the signals and their phase relationship of the signals, will act as the power combiner 710. It will also replace the RF transformer 715 and 720 in FIG. 7.

The present invention provides for a single side band modulator with several advantages. First, the number of components is reduced as discussed above. Second, superior performance is provided. Specifically, by eliminating transformers, the overall loss in the circuit is reduced and the phase and amplitude balances will be improved. The improved phase and amplitude balances along with reduced loss results in enhanced performance. Finally, because there are fewer components, the size of the device can be reduced, and therefore provide cost reduction.

Another aspect of the present invention is the ability to interchange the RF and LO ports on the described SSB modulator. Another aspect of the present invention is the use of the described SSB modulator to implement an image reject mixer.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A single side band modulator, comprising:

a quadrature hybrid;

a first double balanced mixer having a first transformer, a first diode ring, and a first modulating signal input, wherein said first transformer connects said diode ring to said quadrature hybrid;

a second double balanced mixer having a second transformer, a second diode ring, and a second modulating frequency input, wherein said second transformer connects said second diode ring to said quadrature hybrid;

a third transformer; and a first and second connection connecting said first diode ring to said second diode ring in parallel, and further connecting said first and second diode rings to said third transformer.

2. A single side band modulator, comprising:

a quadrature hybrid for splitting a signal into a first split signal and a second split signal 90 degrees out of phase with said first split signal but otherwise identical;

a first double balanced mixer for modulating said first split signal with a first modulating signal to form a first output signal, said first double balanced mixer having a first transformer, a first modulating signal input, and a first diode ring, wherein said first transformer electrically connects said first diode ring to said quadrature hybrid;

a second double balanced mixer for modulating said second split signal with a second modulating signal in balance with said first modulating signal to form a second output signal, said second double balanced mixer having a second transformer, a second modulating signal input, and a second diode ring, wherein said first transformer electrically connects said second diode ring to said quadrature hybrid;

a third transformer; and a first connection and a second connection connecting said first diode ring to said second diode ring in parallel, and further connecting said first and second diode rings to said third transformer;

wherein said third transformer performs the function of a power combiner on the first and second output signals which are in balance.

3. A circuit comprising:

a quadrature hybrid operable to receive an input signal from an input port and output an in-phase signal and a quadrature signal;

a first transformer operable to receive the in-phase signal and a first modulating signal;

a second transformer operable to receive the quadrature signal and a second modulating signal;

a first diode ring connected to the first transformer, the first diode ring being operable to receive the in-phase signal and the first modulating signal;

a second diode ring connected to the second transformer, the second diode ring being operable to receive the quadrature signal and the second modulating signal, and the second diode ring being connected in parallel to the first diode ring; and a third transformer connected to the first and second diode rings at locations where the first and second diode rings are connected in parallel, wherein one of the locations provides an in-phase output signal and another of the locations provides a phase-shifted output signal.

4. The circuit of claim 3, wherein the in-phase and phase-shifted output signals are based on the in-phase signal, the quadrature signal, the first modulating signal and the second modulating signal.

5. The circuit of claim 3, wherein the first and second diode rings are schottky diode rings.

6. The circuit of claim 3, wherein the first and second modulating signals have a frequency between 500 MHz and 3000 MHz.

7. The circuit of claim 3, wherein the first and second modulating signals have a frequency below 500 MHz.

8. The circuit of claim 3, wherein the third transformer is an RF transformer, whereby the RF transformer is operable to match an output impedance and an impedance across the first and second diode rings.

9. The circuit of claim 8, further including an RF port connected to the RF transformer, wherein the RF transformer provides a 50Ω impedance as the output impedance and a 100Ω balanced load across the third pair of connections.

10. The circuit of claim 3, wherein the first transformer applies a 1:4 impedance change to the inphase signal and the second transformer applies the 1:4 impedance change to the quadrature signal.

11. A method of mixing signals in a single sideband modulator, the method comprising:

dividing an input signal into an in-phase signal and a quadrature signal;

mixing the in-phase signal and a first modulating signal with a first double balanced mixer into a first mixed signal, the first double balanced mixer including a first transformer and a first diode ring;

mixing the quadrature signal and a second modulating signal with a second double balanced mixer into a second mixed signal, the second double balanced mixer including a second transformer and a second diode ring, the first double balanced mixer being connected in parallel to the second double balanced mixer by a pair of connections; and providing the first and second mixed signals to a third transformer.

12. The method according to claim 11, wherein one of the first and the second mixed signals is an in-phase output signal and the other one of the first and the second mixed signals is a phase-shifted output signal.

13. The method according to claim 11, wherein the first and second diode rings are schottky diode rings.

14. The method according to claim 11, wherein the first and second modulating signals have a frequency between 500 MHz and 3000 MHz.

15. The method according to claim 10, wherein the first and second modulating signals have a frequency below 500 MHz.

16. The method according to claim 11, wherein the third transformer is an RF transformer, whereby the RF transformer is operable to match an output impedance and an impedance across the first and second diode rings.

17. The method according to claim 16, further comprising providing a combined output signal from the RF transformer to an RF port connected, wherein the RF transformer provides a 50Ω impedance as the output impedance and a 100Ω balanced load across the pair of connections.

18. The method according to claim 11, further comprising:

applying a 1:4 impedance change to the in-phase signal at the first transformer; and applying the 1:4 impedance change to the quadrature signal at the second transformer.

* * * * *

UNITED STATES PATENT AND TRADEMARK OFFICE
CERTIFICATE OF CORRECTION

PATENT NO. : 6,850,575 B1
DATED : February 1, 2005
INVENTOR(S) : Vaseem Ahmed

It is certified that error appears in the above-identified patent and that said Letters Patent is hereby corrected as shown below:

Column 3,
Line 6, delete "FIG. 4 is a circuit diagram of 90 degree hybrid."
Lines 11 and 12, delete "FIG. 5 is block diagram of impedance matching in a single-side band modulator."

Column 6,
Line 42, delete "50Q" and insert -- 50Ω --.
Line 43, delete "100Q" and insert -- 100Ω --.
Line 46, "inphase" should read -- in phase --

Signed and Sealed this

Nineteenth Day of July, 2005

JON W. DUDAS
*Director of the United States Patent and Trademark Office*